United States Patent
Ding et al.

(10) Patent No.: US 10,354,711 B2
(45) Date of Patent: Jul. 16, 2019

(54) DUAL MODE MEMORY SYSTEM AND METHOD OF WORKING THE SAME

(71) Applicant: UNITED MICROELECTRONICS CORP., Hsin-Chu (TW)

(72) Inventors: Yuanli Ding, Singapore (SG); Zhibiao Zhou, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/691,729

(22) Filed: Aug. 30, 2017

(65) Prior Publication Data

US 2019/0066750 A1 Feb. 28, 2019

(51) Int. Cl.
*G11C 11/22* (2006.01)
*H01L 29/786* (2006.01)
*H01L 29/49* (2006.01)

(52) U.S. Cl.
CPC ........ *G11C 11/221* (2013.01); *G11C 11/2297* (2013.01); *H01L 29/4908* (2013.01); *H01L 29/7869* (2013.01); *H01L 29/78648* (2013.01)

(58) Field of Classification Search
CPC .......................... G11C 11/221; H01L 29/4908
See application file for complete search history.

(56) References Cited

U.S. PATENT DOCUMENTS

| | | | |
|---|---|---|---|
| 6,433,609 B1 | 8/2002 | Voldman | |
| 2005/0180220 A1* | 8/2005 | Chen | G11C 11/22 365/145 |
| 2006/0038242 A1* | 2/2006 | Hsu | H01L 29/516 257/407 |
| 2010/0243994 A1* | 9/2010 | Yoon | H01L 21/28291 257/40 |
| 2013/0094274 A1* | 4/2013 | Kaneko | H01L 29/6684 365/145 |
| 2018/0247687 A1* | 8/2018 | Vimercati | G11C 11/2273 |

OTHER PUBLICATIONS

Khandelwal, "Impact of Parasitic Capacitance and Ferroelectric Parameters on Negative Capacitance FinFET Characteristics", Nov. 14, 2016.
Li, "Sub-60mV-Swing Negative-Capacitance FinFET without Hysteresis", Dec. 7, 2015.
Guo, Title of Invention: Semiconductor Device, U.S. Appl. No. 15/655,847, filed Jul. 20, 2017.

* cited by examiner

*Primary Examiner* — Uyen B Tran
(74) *Attorney, Agent, or Firm* — Winston Hsu

(57) ABSTRACT

A dual mode memory system is provided in the present invention, which includes a memory cell array with a plurality of oxide-semiconductor field effect transistors, each said oxide-semiconductor field effect transistor has a ferroelectric layer in the bottom gate to modulate the bottom gate bias voltage according to the polarization voltages provided by the dual mode control unit.

11 Claims, 3 Drawing Sheets

DUAL MODE MEMORY SYSTEM AND METHOD OF WORKING THE SAME

BACKGROUND OF THE INVENTION

1. Field of the Invention

The present invention relates generally to a dual mode memory system and a method of working the same, and more particularly, to a dual mode memory system with oxide-semiconductor field effect transistors (OSFET) and functional ferroelectric layers and a method of working the same.

2. Description of the Prior Art

Due to ultra low leakage, low voltage writing and high endurance, oxide semiconductor field effect transistor (OSFET) devices and OSFET-based system can potentially be used in various low power applications such as used in display devices as a thin film transistor driving element, or in the semiconductor field as a low power element or a memory element.

In order to achieve an ultra-low leakage current and better $V_{th}/V_{sh}$ control for data retention purpose, typically, the threshold voltage ($V_{th}$) of the OSFET semiconductor device is increased, for example, by applying a negative voltage $V_{BG}$ to the bottom gate, in which the bottom gate is further connected to capacitors to hold on certain negative voltage. It is required that the absolute value of $V_{BG}$ is greater than the gate voltage $V_{GE}$ (which is normally positive voltage) applied to the gate of the OSFET semiconductor device.

However, the retaining and the increasing of the negative bias voltage would unfortunately slow down the speed of an OSFET-based circuit. Therefore, a need exists in the industry to provide an effective method for achieving good data retention capability in OSFET-based memory device without trading-off the operating speed.

SUMMARY OF THE INVENTION

In order to achieve both the requirement of good data retention and high-speed operation in memory device, a novel dual mode memory system and method of working the same is provided in the present invention. In the present invention, the bias voltage applied on the memory device may be modulated by a ferroelectric layer, so that the device may be operated in two different modes specifically for data retention and high-speed operation.

In one aspect of the present invention, the preferred embodiment of the present invention provides a novel memory cell. The memory cell includes a bottom gate, a ferroelectric layer on the bottom gate, a first gate oxide layer on the ferroelectric layer, a source/drain on the gate oxide layer, a second gate oxide layer on the source/drain, and a top gate on the second gate oxide layer.

In another aspect of the present invention, the preferred embodiment of the present invention provides a novel dual mode memory system. The dual mode memory system includes a memory cell array with multiple oxide-semiconductor field effect transistors, wherein each oxide-semiconductor field effect transistor is provided with a ferroelectric layer in the bottom gate portion, and a dual mode control unit is dedicated to provide two different polarization voltages to the ferroelectric layer.

In still another aspect of the present invention, the preferred embodiment of the present invention provides a novel method of dual mode working in memory devices. The method includes the steps of providing a memory cell array with multiple oxide-semiconductor field effect transistors, and each oxide-semiconductor field effect transistor is provided with a ferroelectric layer in the bottom gate portion, providing a dual mode control unit connecting to the memory cell array, and selecting two different polarization voltages by a dual mode control unit to the ferroelectric layer of oxide-semiconductor field effect transistors, so that the ferroelectric layer are polarized to different extents and induces two different bottom gate bias voltages for operating the memory devices in two different modes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
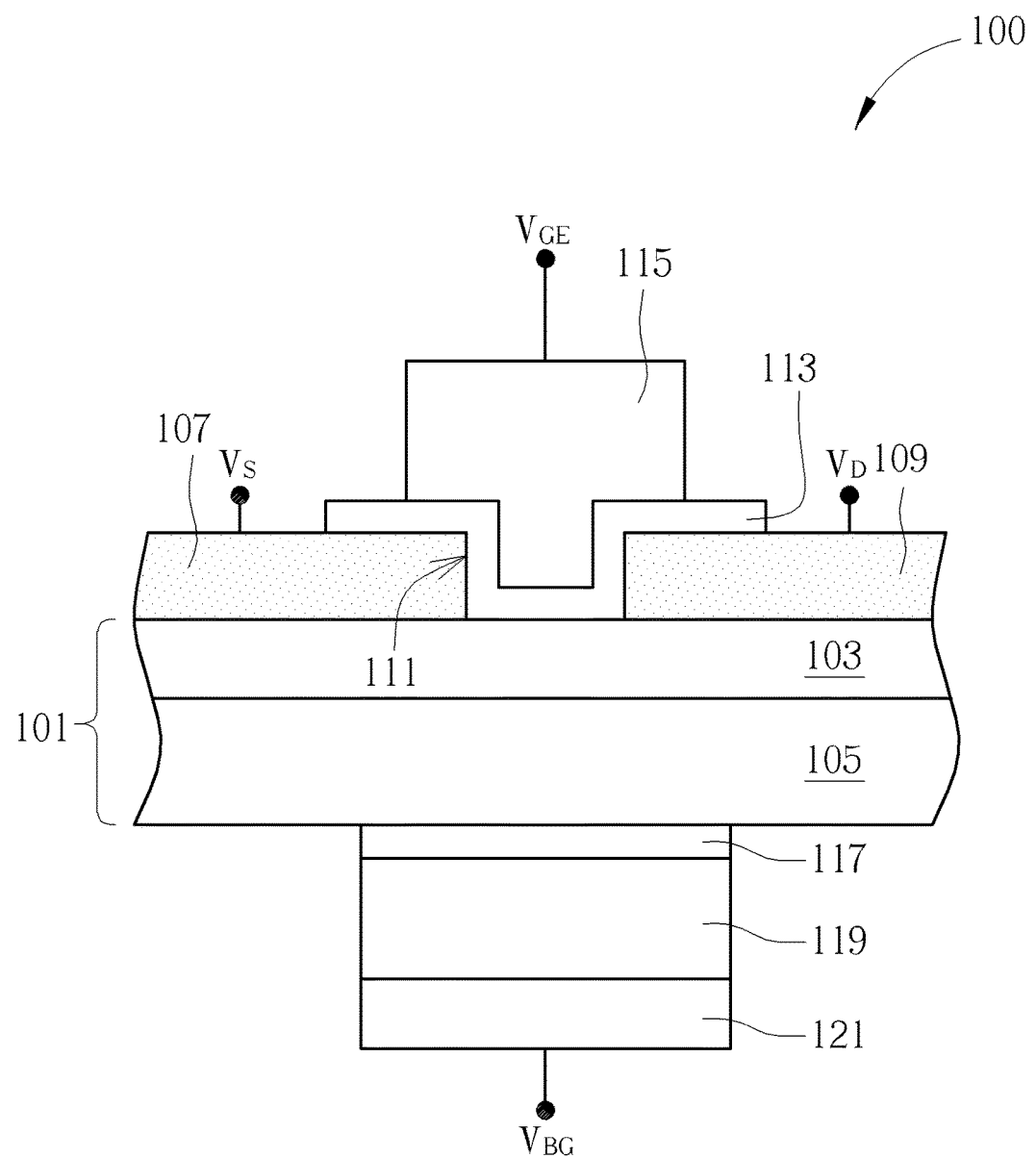
FIG. 1 is a schematic cross-sectional view of the memory cell in accordance with an embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the embodiments. Note that the size, the thickness of films/layers, or regions in diagrams may be exaggerated for clarity.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 3:
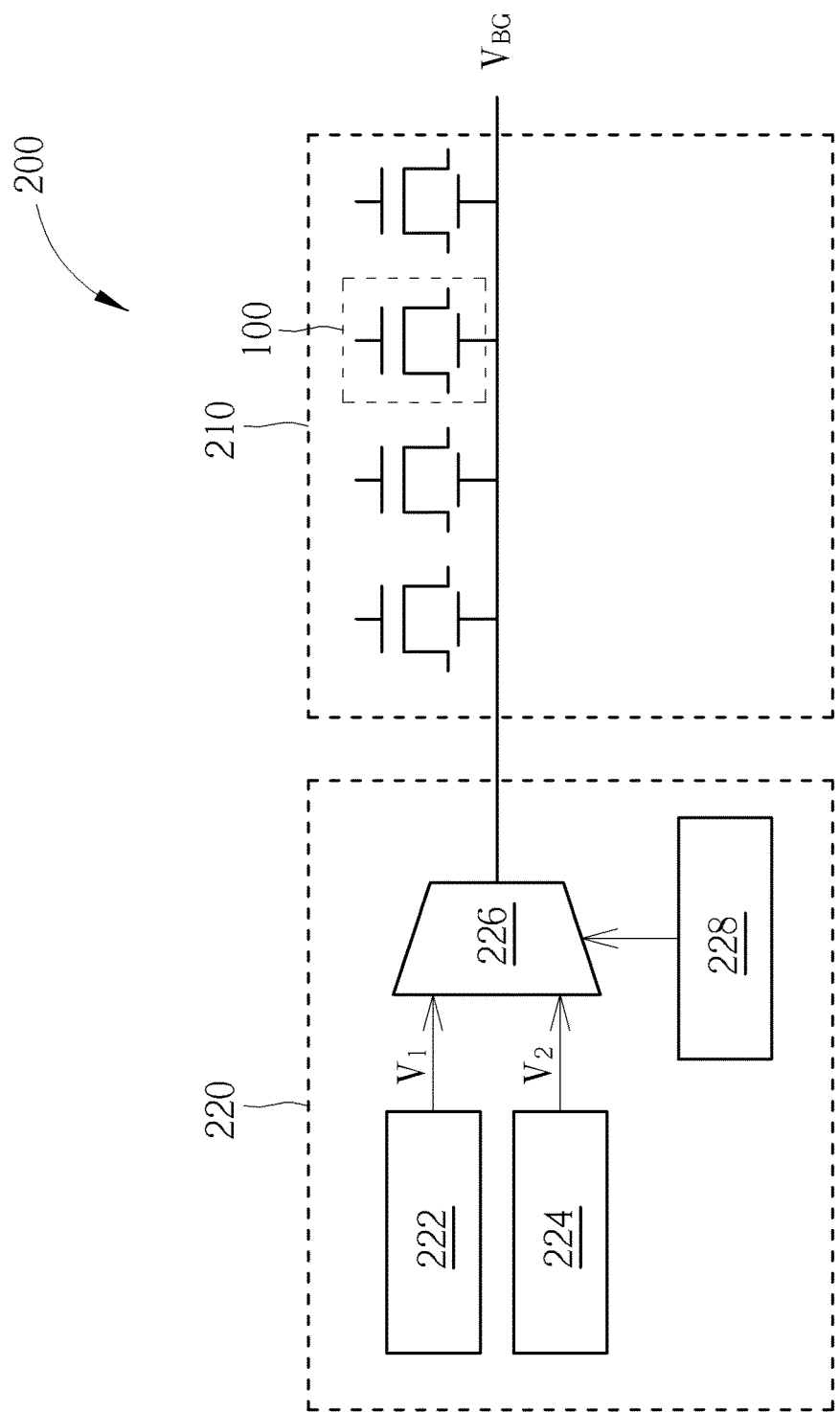
FIG. 3 is a circuit diagram of the dual mode memory system in accordance with an embodiment of the present invention.

Hereinafter, a memory cell and a dual mode memory system according to an embodiment of the present invention will be described with reference to FIG. 1 and FIG. 3, which are a cross-sectional view of the memory cell and the circuit diagram of the dual mode memory system. In FIG. 1 and FIG. 3, some components are enlarged, reduced in size, or omitted for easy understanding and preventing obscuring the subject matters of the present invention.

Please refer to FIG. 1. According to one embodiment, the memory cell 100 of the present invention includes an oxide-semiconductor field effect transistor (OSFET). The OSFET may include a substrate 101, such as a semiconductor substrate. The substrate 101 includes a channel layer 103 and a bottom-gate oxide layer 105 that is in direct contact with the channel layer 103. The channel layer 103 includes an oxide semiconductor material, for example, c-IGZO (crystal indium gallium zinc oxide), a-IGZO (amorphous IGZO), or CAAC-IGZO (c-axis aligned crystalline IGZO), but is not limited thereto. The channel layer 103 may be formed of a single layered or multiple-layered structure. The bottom-gate oxide layer 105 may include a silicon oxide layer, a nitrogen-containing silicon oxide layer, or a high dielectric constant (high-k) material.

According to one embodiment, a source region 107 and a drain region 109 are disposed on the channel layer 103. The source region 107 and the drain region 109 may be formed by using a deposition process and a subsequent patterning process. For example, the deposition process may include a physical vapor deposition (PVD) process or metal organic chemical vapor deposition (MOCVD) process. The patterning process may include a photolithographic process and an etching process. The source region 107 and the drain region 109 may include a single layer of metal or a metal stack having multiple metal layers. For example, the source region 107 and the drain region 109 may include a stacked structure of copper and a copper alloy or a stacked structure of copper and molybdenum, but is not limited thereto. In other embodiments, the source region 107 and the drain region 109 may include a transparent conductive material, such as indium tin oxide (ITO), or the like. A gap 111 is formed between the source region 107 and the drain region 109. The source region 107 and the drain region 109 are spaced from each other by the gap 111 without contacting each other.

According to an embodiment of the present invention, the memory cell 100 further includes a gate dielectric layer 113. The gate dielectric layer 113 conforms to the inner surface of the gap 111. In the gap 111, the gate dielectric layer 113 is in direct contact with the channel layer 103. The gate dielectric layer 113 may include a silicon oxide layer, a nitrogen-containing silicon oxide layer, or a high dielectric constant (high-k) material. A gate electrode (top gate) 115 is disposed on the substrate 101 and completely fills up the gap 111 between the source region 107 and the drain region 109.

According to an embodiment of the present invention, the memory cell 100 further includes an intermediate buffer layer 117 disposed under the bottom-gate oxide layer 105. The material of intermediate buffer layer 117 may include metal compounds such as titanium nitride (TiN) or aluminum oxide ($Al_2O_3$), or metal such as tungsten, titanium, or cobalt. A ferroelectric layer 119 is formed under the buffer layer 117. The material of ferroelectric layer 119 may include $HfZrO_x$(HZO), $BaTiO_3$, $PbTiO_3$, $PbZr_xTiO_3$(PZT), $KNbO_3$, $LiNbO_3$, $LiTaO_3$, $Sr_{1-x}Ba_xNb_2O_6$, $Ba_{0.8}Na_{0.4}Nb_2O_6$, $BiFeO_3$, polyvinyledenedifluoride trifluoroethylene (PVDF-TrFE), $Bi_2O_9SrTa_2$ (SBT) or any combination thereof.

According to an embodiment of the present invention, the memory cell 100 further includes a bottom-gate electrode 121 in direct contact with the ferroelectric layer 119. In operation, the bottom-gate electrode 121 is applied with a bottom gate voltage $V_{BG}$, wherein $V_{BG}<0$ V and the absolute value of $V_{BG}$ is less than the gate voltage $V_{GE}$ applied to the gate electrode 115 of the OSFET semiconductor device ($V_{GE}$ is usually positive voltage or $V_{GE}>0V$). In addition, during operation, the source region 107 is grounded (source voltage $V_S=0V$), and the drain region 109 is applied with a positive voltage (drain voltage $V_D>0V$).

Figure 2:
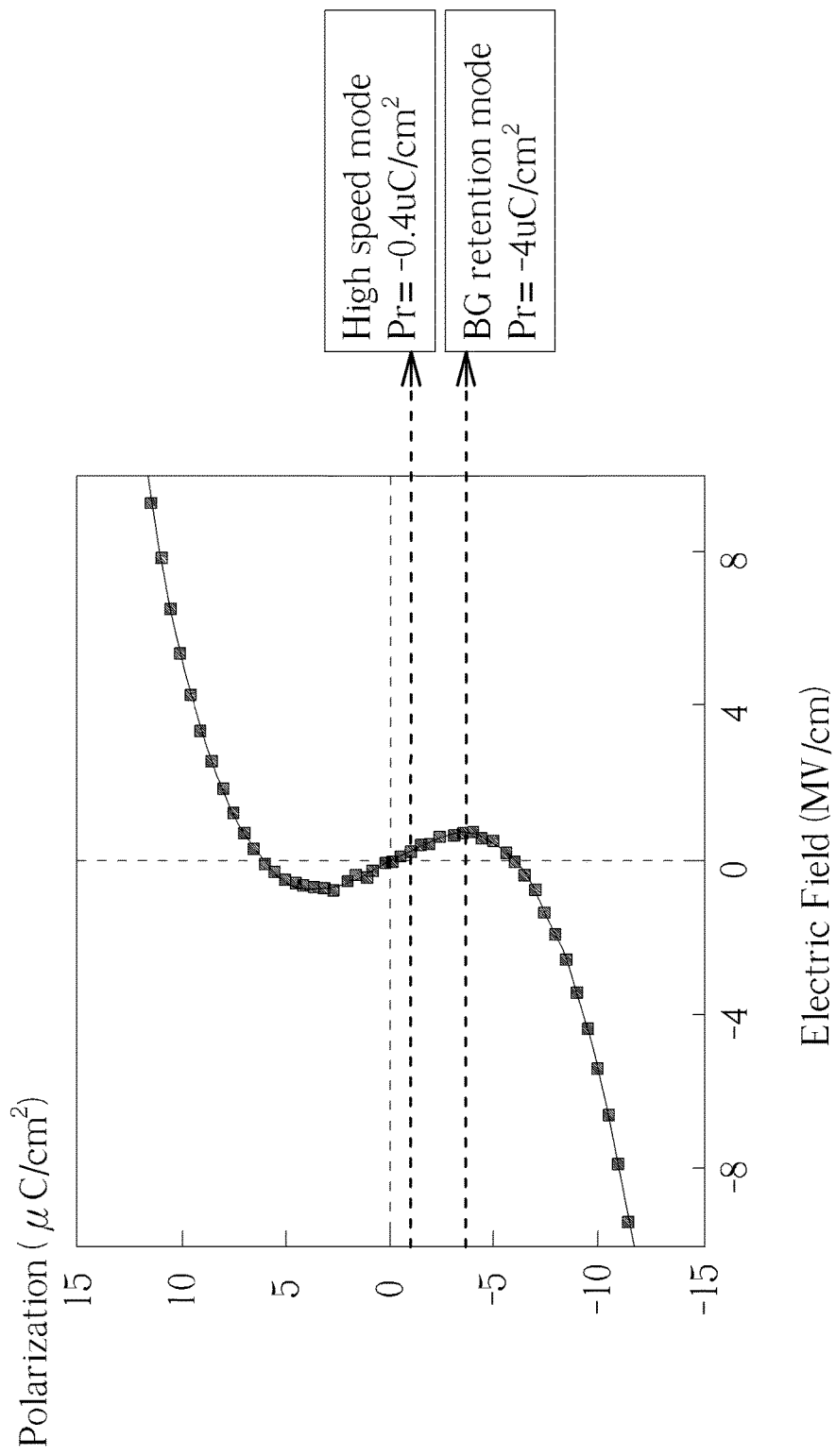
FIG. 2 is a graph showing the curve of polarization vs. electric field of the ferroelectric layer in accordance with an embodiment of the present invention.

In the present invention, the ferroelectric layer 119 disposed between the bottom-gate electrode 121 and the bottom-gate oxide layer 105 is dedicated to modulate and define the $V_{BG}$. FIG. 2 is a graph showing the curve of polarization vs. electric field in ferroelectric materials. As shown in FIG. 2, the ferroelectric material such as PZT, SBT or $HfZrO_2$ has a very high remanent polarization (Pr) value which can induce the same density of positive and negative charges on the electrodes. The induced charges may be used to define two different bottom gate retention bias levels through bottom-gate oxide layer 105 for bottom gate retention mode (power saving mode) and high-speed mode, respectively. For example, The Pr value of the ferroelectric material will be set at $-0.4$ $\mu C/cm^2$ and $-4$ $\mu C/cm^2$ in high-speed mode and in bottom gate retention mode, respectively.

The following equations (1)-(4) provide the calculation of induced bottom gate bias voltage after polarization:

$$V=Q/C \qquad (1)$$

$$C=K\cdot\varepsilon_0 A/d \qquad (2)$$

$$Pr=Q/A \qquad (3)$$

$V = Q/(K \cdot \varepsilon_0 A/d) = Pr \cdot d/(K \cdot \varepsilon_0)$ (4)

wherein:
V is the induced bottom gate bias voltage;
C is capacitance;
A is area;
Pr is remanent polarization of the ferroelectric layer 119, which is set at $-0.4$ μC/cm$^2$ and $-4$ μC/cm$^2$ in HfZrO$_2$ ferroelectric material in high-speed mode and in bottom gate retention mode respectively;
K is relative permittivity of the bottom-gate oxide layer 105, which is set at 3.9;
$\varepsilon_0$ is permittivity of free space, which is $8.854 \cdot 10^{-12}$ F/m;
d is thickness of bottom-gate oxide layer 105, which is set at 10 nm.

According to the calculation above, two induced bottom gate bias voltages, $-1.12V$ and $-11.2V$, are resulted respectively with different Pr values. Higher induced bottom gate bias voltage (ex. $-1.12V$) would result in lower threshold voltage in the OSFET device, thus it is suitable to induce higher bottom gate bias voltage to enable the devices to be operated in time-critical high-speed applications. On the other hand, lower induced bottom gate bias voltage (ex. $-11.2V$) would result in lower driving currents and lower power consumption, thus it is suitable to induce lower bottom gate bias voltage in order to save the power in data retention mode.

The Pr value of the ferroelectric layer 119 may be easily modulated by the polarization voltage or the electric field applied on the ferroelectric layer 119. In the embodiment of the present invention, two different polarization voltages will be provided to the ferroelectric layer 119 in the memory cell 100, thereby modulating the Pr value and inducing different gate retention bias voltages for dual mode. Please refer to FIG. 3. FIG. 3 is a circuit diagram of the dual mode memory system in accordance with an embodiment of the present invention. In this embodiment, a complete dual mode memory system 200 is provided with a memory cell array 210 having a plurality of memory cell 100 arranged in columns and rows and a dual mode control unit 220 with several functional modules connecting to the memory cell array 210. In the memory cell array 210, a plurality of memory cell 100 as described in the embodiment of FIG. 1 is provided and connected through a $V_{BG}$ line. Each memory cell 100 may be preferably an oxide-semiconductor field effect transistor with the ferroelectric layer between the bottom gate electrode and the bottom gate oxide layer. For the simplicity of the drawing, only one row of the memory cell is shown in the memory cell array 210 of FIG. 3.

The dual mode control unit 220 is dedicated to provide two different polarization voltages to the ferroelectric layer of each memory cell 100 in the memory array 210 through the $V_{BG}$ line. The dual mode control unit 220 includes signal module units, such as a bottom gate retention module unit 222 and a high-speed module unit 224. In the embodiment, the bottom gate retention module unit 222 and the high-speed module unit 224 first provide two different polarization voltages $V_1$ and $V_2$ to a multiplexer 226. In turn, the multiplexer 226 is connected and controlled by a control logic 228. The control logic 228 generates control signal to the multiplexer 226 based on the requirement to select one of the two different polarization voltages $V_1$ and $V_2$ to the connecting $V_{BG}$ lines in the memory cell array 210. The selected polarization voltage $V_1$ or $V_2$ is applied to the bottom gates of the OSFETs in the row, in which the ferroelectric layer therein would modulate the applying polarization voltage as described in calculation of equations (1)-(4) and induce the desired bottom gate bias voltage in the OSFET. While in this embodiment, the induced bias voltage in the OSFET would be around $-10V$ and $-1V$ resulted from the selected polarization voltage $V_1$ or $V_2$ by the bottom gate retention module unit 222 and the high-speed module unit 224.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dual mode memory system, comprising:
   a memory cell array with a plurality of oxide-semiconductor field effect transistors, each said oxide-semiconductor field effect transistors comprises a channel layer, a gate dielectric layer, a top gate on one side of said channel layer and on said gate dielectric layer, a bottom-gate oxide layer under said channel layer, a buffer layer under said bottom-gate oxide layer, a bottom gate on the other side of said channel layer, and a ferroelectric layer between said bottom gate and said buffer layer, wherein said gate dielectric layer is a silicon oxide layer, a nitrogen-containing silicon oxide layer, or a high dielectric constant (high-k) material; and
   a dual mode control unit, wherein said dual mode control unit provides two different polarization voltages to said bottom gate and said ferroelectric layer.

2. The dual mode memory system of claim 1, wherein the material of said ferroelectric layer comprises HfZrO$_x$ (HZO), BaTiO$_3$, PbTiO$_3$, Bi$_2$O$_9$SrTa$_2$ (SBT), PbZr$_x$TiO$_3$ (PZT), KNbO$_3$, LiNbO$_3$, LiTaO$_3$, Sr$_{1-x}$Ba$_x$Nb$_2$O$_6$, Ba$_{0.8}$Na$_{0.4}$Nb$_2$O$_6$, BiFeO$_3$, polyvinyledenedifluoridetrifluoroethylene (PVDF-TrFE), or any combination thereof.

3. The dual mode memory system of claim 1, wherein said bottom gate connects to one of said two polarization voltages selected by said multiplexer and modulated by said ferroelectric layer, wherein said polarization voltage is less than 0V and an absolute value of said polarization voltage is less than a gate voltage applied to said top gate.

4. The dual mode memory system of claim 3, wherein a bias voltage is generated by modulating said polarization voltage through said ferroelectric layer, and said bias voltage is $-1V$ and $-10V$ respectively in high-speed mode and bottom gate retention mode.

5. The dual mode memory system of claim 1, wherein said dual mode control unit comprises signal module units, control logic and multiplexer.

6. The dual mode memory system of claim 5, wherein said signal module units comprises bottom gate retention module unit and high-speed module unit.

7. The dual mode memory system of claim 6, wherein said bottom gate retention module unit and said high-speed module unit generate said different polarization voltages.

8. The dual mode memory system of claim 5, said control logic generates control signal based on requirement to select one of said different polarization voltages to polarize said ferroelectric layer in said oxide-semiconductor field effect transistors.

9. A method of dual mode working in memory devices, comprising:
   providing a memory cell array with a plurality of oxide-semiconductor field effect transistors, and each said oxide-semiconductor field effect transistors comprises a channel layer, a gate dielectric layer, a top gate on one side of said channel layer and on said gate dielectric layer, a bottom-gate oxide layer under said channel layer, a buffer layer under said bottom-gate oxide layer, a bottom gate on the other side of said channel layer, and a ferroelectric layer between said bottom gate and said buffer layer, wherein said gate dielectric layer is a silicon oxide layer, a nitrogen-containing silicon oxide layer, or a high dielectric constant (high-k) material;

providing a dual mode control unit connecting to said memory cell array; and selecting two different polarization voltages by said dual mode control unit to said bottom gate and said ferroelectric layer of said oxide-semiconductor field effect transistors, so that said ferroelectric layer are polarized to different extents and induce two different bias voltages for operating said memory devices in two different modes.

10. The method of dual mode working in memory devices of claim 9, wherein said two modes are power saving mode that operates in lower said bias voltages and high-speed mode that operates in higher said bias voltages, respectively.

11. The method of dual mode working in memory devices of claim 10, wherein said bias voltage are −1V and −10V respectively in said high-speed mode and in said power saving mode.

* * * * *